(12) United States Patent
Sugimoto

(10) Patent No.: US 12,466,666 B2
(45) Date of Patent: Nov. 11, 2025

(54) METHOD OF TEACHING TRANSFER DEVICE, AND TRANSFER SYSTEM

(71) Applicant: Tokyo Electron Limited, Tokyo (JP)

(72) Inventor: Takashi Sugimoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 870 days.

(21) Appl. No.: 17/712,614

(22) Filed: Apr. 4, 2022

(65) Prior Publication Data

US 2022/0324659 A1  Oct. 13, 2022

(30) Foreign Application Priority Data

Apr. 8, 2021 (JP) .................................. 2021-065772

(51) Int. Cl.
  *B65G 47/90* (2006.01)
  *H01J 37/32* (2006.01)
(52) U.S. Cl.
  CPC ...... *B65G 47/905* (2013.01); *H01J 37/32715* (2013.01); *H01J 2237/20292* (2013.01)
(58) Field of Classification Search
  CPC ............... B65J 37/905; H01J 37/32715; H01J 2237/20292
  USPC ........................................................ 700/121
  See application file for complete search history.

(56) References Cited

U.S. PATENT DOCUMENTS

| 2006/0138367 | A1* | 6/2006 | Kondoh | ............ | H01L 21/67259 250/559.12 |
| 2014/0178162 | A1* | 6/2014 | Morikawa | ......... | H01L 21/67772 414/811 |
| 2019/0371635 | A1* | 12/2019 | Oori | .................. | H01L 21/67259 |
| 2020/0373179 | A1* | 11/2020 | Ayabe | ....................... | B08B 3/08 |
| 2022/0351994 | A1* | 11/2022 | Yoshida | ............ | H01L 21/68707 |

FOREIGN PATENT DOCUMENTS

| JP | 2012049382 A | 3/2012 |
| JP | 2014-175608 A | 9/2014 |
| JP | 2020-53417 A | 4/2020 |
| KR | 10-2020-0034607 A | 3/2020 |

* cited by examiner

*Primary Examiner* — Md Azad
(74) *Attorney, Agent, or Firm* — Nath, Goldberg & Meyer; Jerald L. Meyer; Tanya E. Harkins

(57) ABSTRACT

A method of teaching a transfer device provided with a pick configured to hold a substrate and a mapping sensor, includes: detecting, in a reference accommodation container in which reference substrates are accommodated, height positions of the reference substrates using the mapping sensor and setting a reference position in a height direction; detecting, in a plurality of accommodation containers in which production substrates to be processed in a substrate processing apparatus are accommodated, height positions of the production substrates using the mapping sensor and storing information about the height positions; and correcting the reference position based on the stored information in the plurality of accommodation containers.

11 Claims, 5 Drawing Sheets

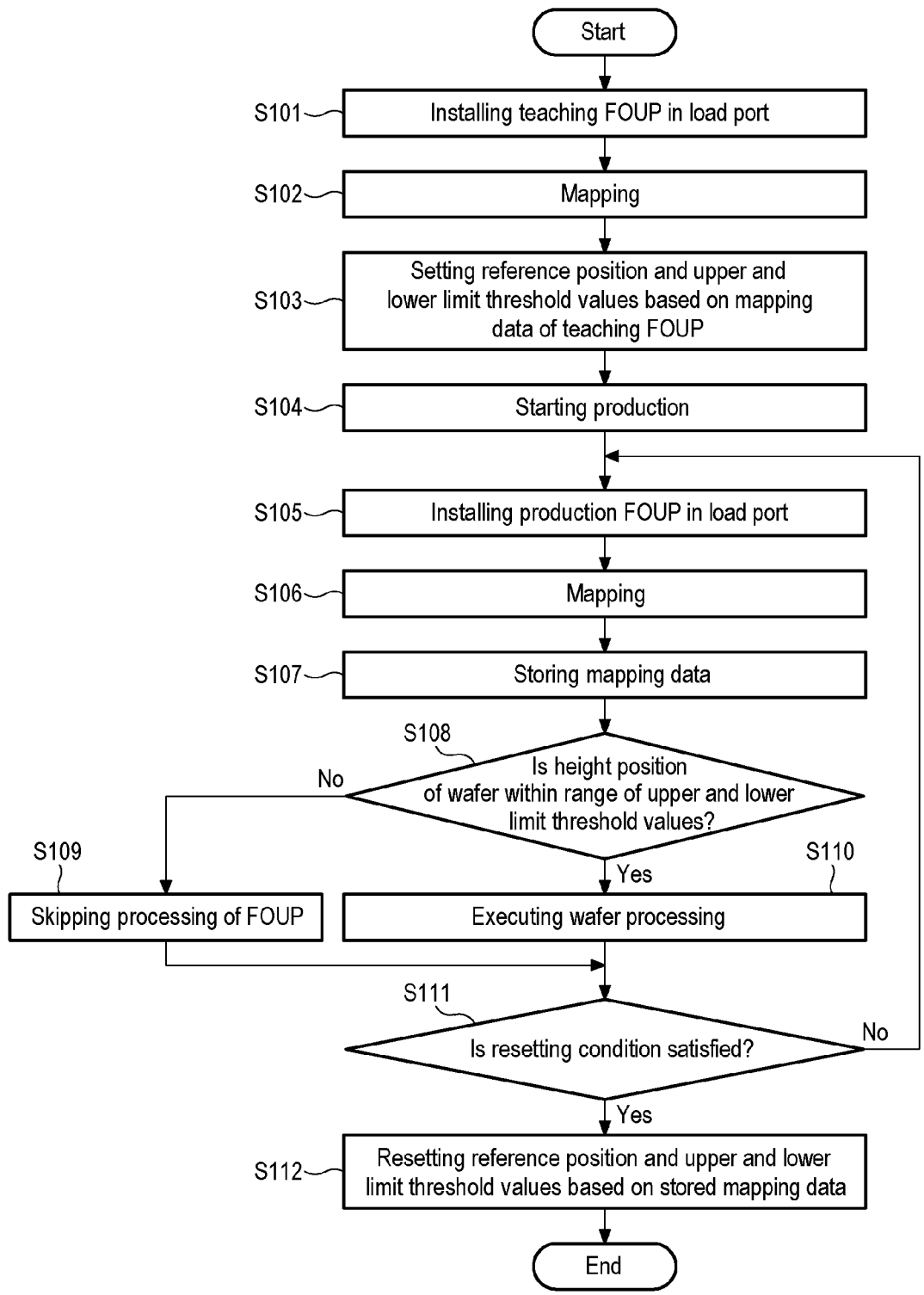

METHOD OF TEACHING TRANSFER DEVICE, AND TRANSFER SYSTEM

CROSS-REFERENCE TO RELATED APPLICATION

This application is based upon and claims the benefit of priority from Japanese Patent Application No. 2021-065772, filed on Apr. 8, 2021, the entire contents of which are incorporated herein by reference.

TECHNICAL FIELD

The present disclosure relates to a method of teaching a transfer device, and a transfer system.

BACKGROUND

A transfer device for transferring a substrate is known.

Patent Document 1 discloses a load port provided adjacent to a wafer transfer chamber to constitute an EFEM (Equipment Front End Module) together with the wafer transfer chamber and used when receiving a transferred FOUP (Front Opening Unified Pod) to transfer a wafer stored in the FOUP between the interiors of the wafer transfer chamber and the FOUP, wherein the load port includes a mapping device configured to perform mapping for the wafer and a transfer device configured to transfer the wafer between the interiors of the FOUP and the wafer transfer chamber.

PRIOR ART DOCUMENT

Patent Document

Patent Document 1: Japanese Laid-Open Patent Publication No. 2012-049382

SUMMARY

According to an aspect of the present disclosure, a method of teaching a transfer device provided with a pick configured to hold a substrate and a mapping sensor, includes: detecting, in a reference accommodation container in which reference substrates are accommodated, height positions of the reference substrates using the mapping sensor and setting a reference position in a height direction; detecting, in a plurality of accommodation containers in which production substrates to be processed in a substrate processing apparatus are accommodated, height positions of the production substrates using the mapping sensor and storing information about the height positions; and correcting the reference position based on the stored information in the plurality of accommodation containers.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a flowchart illustrating an example of an operation of teaching an atmospheric transfer arm.

DETAILED DESCRIPTION

Figure 1:
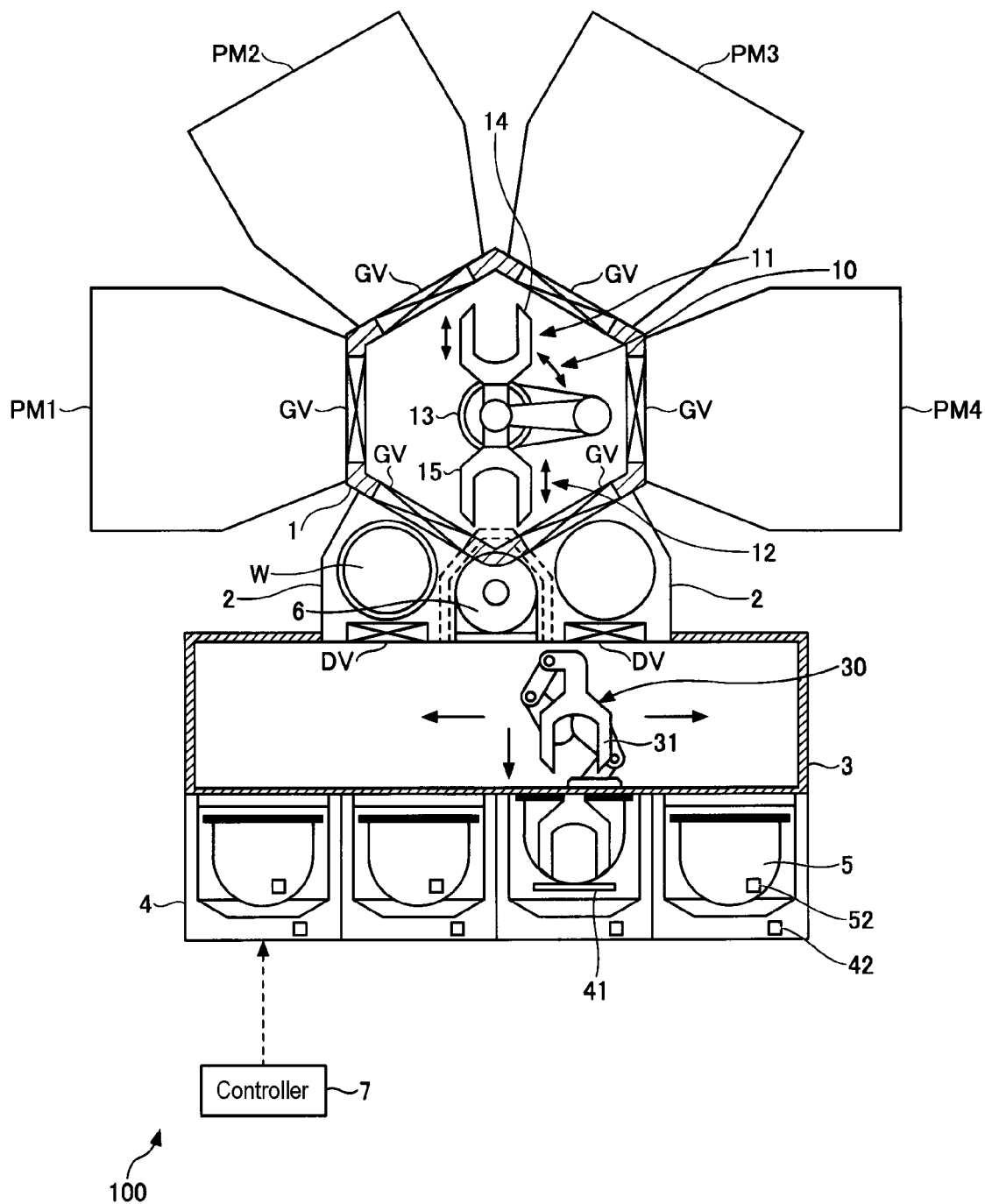
FIG. 1 is a configuration view illustrating an example of a substrate processing apparatus according to an embodiment.

Hereinafter, embodiments of the present disclosure will be described with reference to the accompanying drawings. In each of the drawings, the same constituent elements will be denoted by the same reference numerals, and redundant descriptions thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing Apparatus 100>

A substrate processing apparatus 100 according to an embodiment will be described with reference to FIG. 1. FIG. 1 is a configuration view illustrating an example of the substrate processing apparatus 100 according to an embodiment.

The substrate processing apparatus 100 includes a vacuum transfer chamber 1 kept at a vacuum and for transferring a wafer W, which is an example of a substrate, and a plurality of processing modules, each of which is hermetically connected to the periphery of the vacuum transfer chamber 1 to perform a predetermined process on the wafer W. In this example, for example, four processing modules are provided, but one or more processing modules may be provided. Hereinafter, the four processing modules will be referred to as processing chambers PM1, PM2, PM3, and PM4, and may be collectively referred to as a processing chamber PM. The four processing chambers PM1 to PM4 and two load-lock chambers 2 are connected to respective sides of the hexagonal vacuum transfer chamber 1.

In the processing chambers PM1 to PM4, the predetermined process is performed on the wafer W in the state of being heated to a predetermined temperature. For example, the processing chambers PM1 to PM4 may be chemical oxide removal (COR) processing chambers or post heat treatment (PHT) processing chambers. In addition, for example, the process performed in the processing chambers PM1 to PM4 may be a dry etching process using plasma or an ashing process. Other processes may be a film forming process by thermal chemical vapor deposition (CVD) or atomic layer deposition (ALD), and an annealing process. In addition, a moisture removal process of heating the wafer W to, for example, about 200 degrees C. to remove moisture included in the wafer W may be performed. Each of the processing chamber PM1 and the processing chamber PM4 includes a stage on which the wafer W is placed, a gas supply path configured to supply a processing gas into the chamber, an exhaust pipe for evacuating the interior of the chamber, and the like.

A substrate transfer device 10 is arranged inside the vacuum transfer chamber 1. The substrate transfer device 10 includes two arms such as a first transfer arm 11 and a second transfer arm 12, and transfers the wafer W while holding the wafer W by one or both of the two arms.

The first transfer arm 11 and the second transfer arm 12 are configured to be rotatable and liftable coaxially by a rotation mechanism 13 provided on the bottom surface of the vacuum transfer chamber 1. Each of tip end portions of the first transfer arm 11 and the second transfer arm 12 is formed in, for example, a U-shape to form a pick 14 or 15 for holding the wafer W, and is configured to be able to independently move forward and backward in a horizontal direction with respect to the processing chambers PM1 to PM4 and the two load-lock chambers 2.

Each of the first transfer arm 11 and the second transfer arm 12 is connected to the rotation mechanism 13 such that, for example, the traveling directions thereof when extending from the rotation mechanism 13 are opposite to each other. By the cooperation between the forward/backward movement and upward/downward movement of the first transfer arm 11 and the second transfer arm 12 and the upward/downward movement of lifting pins provided in the stage on which the wafer W is placed in each processing chamber PM, the wafer W is delivered between each processing chamber PM and the load-lock chambers 2.

The load-lock chambers 2 are hermetically connected to the vacuum transfer chamber 1 and switch the internal atmospheres thereof between a vacuum atmosphere and an atmospheric atmosphere. In the present embodiment, two load-lock chambers 2 are provided, but the present disclosure is not limited thereto.

A common atmospheric transfer chamber 3 for transferring the wafer W in the atmospheric atmosphere is hermetically connected to the two load-lock chambers 2. In the atmospheric transfer chamber 3, for example, stages of load ports 4, each of which is configured to place thereon a FOUP 5 in which, for example, 25 wafers W are accommodated, are provided at a plurality of places. In the present embodiment, the stages are provided at four locations, but the present disclosure is not limited thereto. A pressing mechanism 41 functions to press the FOUP 5 on each stage toward the atmospheric transfer chamber 3.

In addition, the FOUP 5 is provided with an identifier 52. The identifier 52 is, for example, a barcode, an IC tag, or the like, and has identification information for individually identifying the FOUP 5. The identification information may include information on the type of the FOUP 5. In addition, each load port 4 includes a detector 42 configured to detect information from the identifier 52 of the FOUP 5 installed in the load port 4.

Inside the atmospheric transfer chamber 3, an atmospheric transfer device 30 configured to perform delivery of the wafer W between the load-lock chambers 2 and the FOUPs 5 is provided. The atmospheric transfer device 30 includes an atmospheric transfer arm including an arm that is liftable in the vertical direction and rotatable around a vertical axis, and a slide mechanism (not illustrated) configured to be movable in parallel along the arrangement of the load ports 4. An alignment device 6 configured to align the wafer W is installed between the two load-lock chambers 2. In the following description, the atmospheric transfer device 30 and the controller 7 are also referred to as a transfer system.

Gate valves GV are provided between the vacuum transfer chamber 1 and the processing chambers PM1 to PM4 and between the vacuum transfer chamber 1 and the load-lock chambers 2, respectively, and door valves DV are provided between the load-lock chamber 2 and the atmospheric transfer chamber 3. Thus, the wafers W are hermetically transferred by opening and closing the gate valves GV and the door valves DV.

The substrate processing apparatus 100 having such a configuration includes, for example, a controller 7 configured with a computer. The controller 7 controls the overall operation of the substrate processing apparatus 100. The controller 7 includes a memory and a CPU, and the memory stores programs and recipes used for processing in respective processing chambers PM. The programs include a program related to an input operation or display of processing parameters. In the recipes, process conditions such as the temperature at which the processing chambers PM are heated, processing procedures, and transfer paths of wafers W are set.

According to the programs and the recipes stored in the memory, the CPU uses the atmospheric transfer device 30, the first transfer arm 11, and the second transfer arm 12 to transfer the wafers W taken out from the FOUPs 5 to the plurality of processing chambers PM via predetermined paths. Then, the CPU executes a predetermined process in each processing chamber PM based on the process conditions set in the recipes. The programs may be stored in a non-transitory computer-readable storage medium, for example, a storage such as a flexible disk, a compact disk, a hard disk, or a magneto-optical (MO) disk, and installed on the controller 7, or may be downloaded using a communication function.

Unprocessed wafers W carried out from the FOUPs 5 are transferred to the load-lock chambers 2 by the atmospheric transfer device 30. Subsequently, the unprocessed wafers W are transferred to the processing chamber PM by the first transfer arm 11 or the second transfer arm 12. In the processing chambers PM, a desired process (e.g., a film forming process or the like) is performed on the wafers W. The wafer W processed in a processing chamber PM may be transferred to another processing chamber PM by the first transfer arm 11 or the second transfer arm 12 to be further processed. The processed wafers W are returned to the FOUP 5 via the load-lock chambers 2.

<Atmospheric Transfer Device 30>

Figure 2:
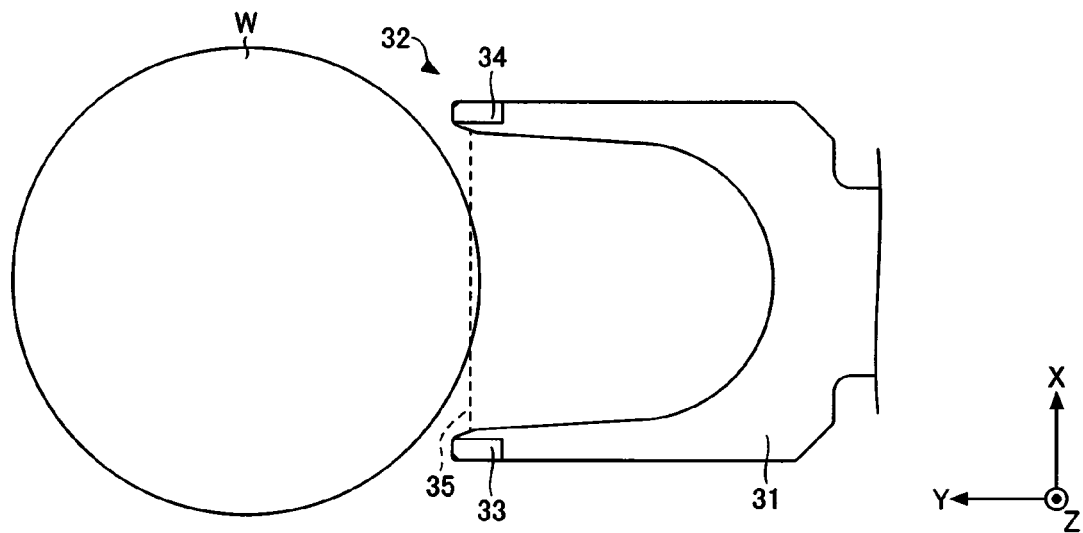
FIG. 2 is a plan view illustrating an example of a pick of an atmospheric transfer device and a wafer.

Next, the atmospheric transfer device 30 will be further described. FIG. 2 is a plan view illustrating an example of a pick 31 of the atmospheric transfer device 30 and the wafer W. The pick 31 is provided with a mapping sensor 32. The mapping sensor 32 includes a light emitter 33 and a light receiver 34. By detecting a beam 35 emitted from the light emitter 33 by the light receiver 34, the presence or absence of a light-shielding object (the wafer W) in the course of the beam 35 is detected.

Figure 3:
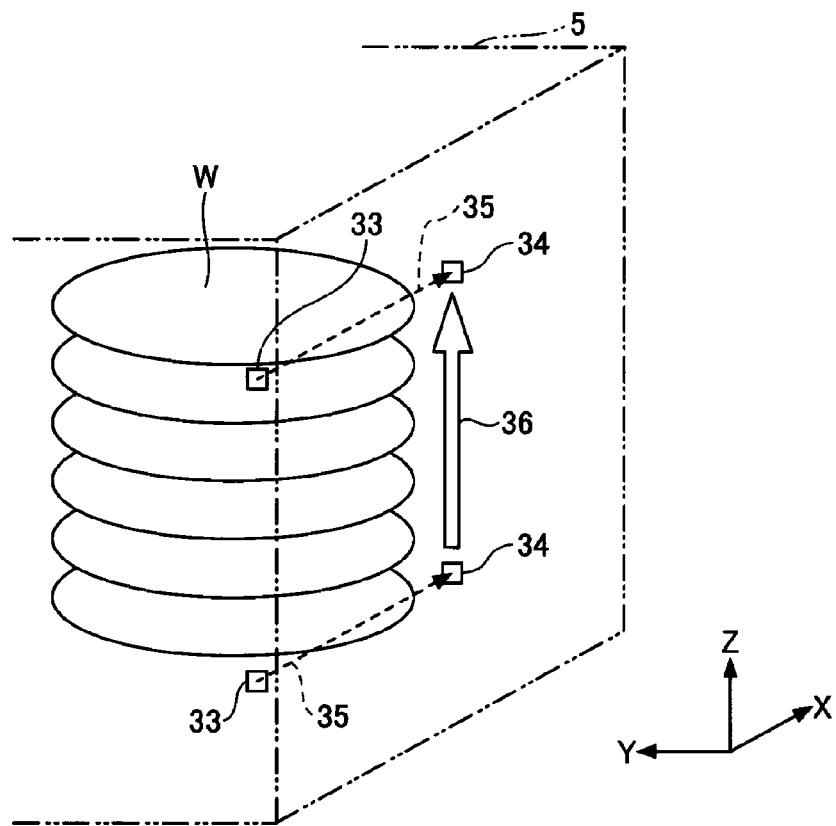
FIG. 3 is an example of a perspective view illustrating a mapping operation.

FIG. 3 is an example of a perspective view illustrating a mapping operation. By raising the light emitter 33 and the light receiver 34 (as indicated by arrow 36), positions in the height direction of the wafers W accommodated in the FOUP 5 may be detected (mapped).

<Operation of Teaching Atmospheric Transfer Device 30 and Substrate Processing of Substrate Processing Apparatus 100>

Next, an operation of teaching the atmospheric transfer device 30 will be described with reference to FIGS. 4 to 6. Here, an operation of teaching a reference position of the wafer W of each slot that is accommodated in the FOUP 5 to the atmospheric transfer device 30 will be described.

FIG. 4 is a flowchart illustrating an example of the operation of teaching the atmospheric transfer device 30 and the substrate processing of the substrate processing apparatus 100.

In step S101, an operator installs a teaching FOUP (a reference accommodation container) 5 in a load port 4. Here, the teaching FOUP 5 installed in step S101 is a FOUP 5 used for setting a reference position and upper and lower limit threshold values of each slot of the FOUP 5 (step S103 described later). Here, the reference position of each slot of the FOUP 5 is a reference value of the height position of the wafer W accommodated in each slot. The upper and lower limit threshold values of each slot of the FOUP 5 are values indicating an allowable range at the height position of the wafer W of each slot. When the height position of the wafer W accommodated in a slot is within the range of the upper and lower limit threshold values of the slot, it is determined that the wafer W is normally accommodated in the slot. The teaching FOUP 5 has a plurality of (e.g., 25) slots for accommodating wafers W. In addition, teaching wafers (reference substrates) W are accommodated in the slots (e.g., $1^{st}$ to $25^{th}$ slots) of the teaching FOUP 5.

In step S102, the controller 7 maps the teaching wafers W accommodated in the teaching FOUP 5. Here, the controller 7 detects (maps) the height positions of the teaching wafers W accommodated in the teaching FOUP 5 using the mapping sensor 32 provided on the pick 31 (see FIGS. 2 and 3). The controller 7 controls the atmospheric transfer device 30 to move the pick 31 to a predetermined mapping position and raise the pick 31 in the Z direction to perform mapping.

In step S103, based on the mapping data of the teaching FOUP 5, the controller 7 sets a reference position and upper and lower limit threshold values of each slot of the FOUP 5. For example, the mapping sensor 32 detects the height positions of the teaching wafers W accommodated in the lowermost $1^{st}$ slot and the uppermost $25^{th}$ slot, and sets the height positions to a reference position of the $1^{st}$ slot and a reference portion of the $25^{th}$ slot, respectively. For the $2^{nd}$ to $24^{th}$ slots, a distance between the reference position of the $1^{st}$ slot and the reference position of the $25^{th}$ slot is equally divided to set reference positions of the $2^{nd}$ to $24^{th}$ slots. In addition, in each slot, the upper and lower limit threshold values (the lower limit threshold value and upper limit threshold value) are set based on the reference position of the slot. Here, the upper limit threshold value of each slot is, for example, a height position obtained by adding a predetermined addition value to the reference position of each slot. In addition, the lower limit threshold value of each slot is, for example, a height position obtained by subtracting a predetermined subtraction value from the reference position of each slot. Further, the addition value and the subtraction value are values set in advance based on the standard of the FOUP 5 standard and the height position at which the wafer W can be taken out without interfering with the wafer W in an adjacent slot when the atmospheric transfer device 30 takes out the wafer W from the FOUP 5.

In step S104, the controller 7 starts the production of semiconductor products. That is, the controller 7 repeats the following steps S105 to S107 to execute a predetermined process on production wafers W in the substrate processing apparatus 100 (the processing chambers PM1 to PM4) to produce semiconductor products (not illustrated).

In step S105, the FOUP 5 installed in the load port 4 is removed, and a new production FOUP (accommodation container) 5 is installed in the load port 4. The production FOUP 5 is installed in and removed from the load port 4 by an overhead hoist transfer (OHT). Here, the production FOUP 5 installed in step S105 is a FOUP 5 in which production wafers (production substrates) W are accommodated. The production wafers W are wafers from which semiconductor products (not illustrated) are produced by being subjected to a predetermined process in the substrate processing apparatus 100 (the processing chambers PM1 to PM4). The production FOUP 5 has a plurality of (e.g., 25) slots for accommodating wafers W. The wafer W is accommodated in each slot of the production FOUP 5.

In step S106, the controller 7 maps the wafers W accommodated in the production FOUP 5. Here, the controller 7 detects (maps) the height positions of the wafers W accommodated in the production FOUP 5 using the mapping sensor 32 provided on the pick 31 (see FIGS. 2 and 3). The controller 7 controls the atmospheric transfer device 30 to move the pick 31 to a predetermined mapping position and raise the pick 31 in the Z direction to perform mapping.

In step S107, the controller 7 stores mapping data detected in step S106 in a storage (not illustrated) of the controller 7. The mapping data may be stored in association with identification information of the production FOUP 5 detected by the detector 42.

In step S108, the controller 7 determines, for each slot, whether or not the height position of the wafer W detected in step S106 is within the range of the upper and lower limit threshold values of each slot set in step S103.

When the height position of the wafer W is not within the range of the upper and lower limit threshold values ("No" in S108), the process of the controller 7 proceeds to step S109. In step S109, the controller 7 determines that an error has occurred and skips the processes for the FOUP 5. In other words, the controller 7 determines that the atmospheric transfer device 30 may not be able to normally take out the wafer W from a slot of the production FOUP 5, and skips the processes for the FOUP 5 (transfer and processing of the wafers W accommodated in the FOUP 5). Further, the controller 7 may cause a display device (not illustrated) to display a warning that urges checking the state of the wafers W or the like. This makes it possible to notify the operator of the occurrence of an error. In addition, the controller 7 may notify a host computer that manages the substrate processing apparatus 100 of the occurrence of an error. Thereafter, the process of the controller 7 proceeds to step S111.

When the height position of the wafer W is within the range of the upper and lower limit threshold values ("Yes" in S108), the process of the controller 7 proceeds to step S110. In step S110, the controller 7 causes the wafers W to be transferred to the processing chambers PM from the production FOUP 5 and the processing chambers PM to execute a predetermined process on the wafers W.

The controller 7 determines that the wafers W are correctly accommodated in the slots of the production FOUP 5. In other words, the controller 7 determines that it is possible for the atmospheric transfer device 30 to normally take out and transfer the wafers W from the slots of the production FOUP. Thereafter, the controller 7 causes the atmospheric transfer device 30 to transfer the wafers W from the slots of the production FOUP 5 to the load-lock chambers 2, and further causes the substrate transfer device 10 to transfer the wafers W from the load-lock chambers 2 to the processing chambers PM. Thus, a desired process is performed on the wafers in the processing chambers PM. The processed wafers W are returned to the FOUP 5 by the substrate transfer device 10 and the atmospheric transfer device 30. Thereafter, the process of the controller 7 proceeds to step S111.

In step S111, the controller 7 determines whether or not the conditions for resetting the reference positions and the upper and lower limit threshold values are satisfied. Here, the resetting conditions are conditions for determining the timing for resetting the reference positions and the upper and lower limit threshold values. For example, when the operator performs an operation to execute the resetting after recording the mapping data for an arbitrary number of production FOUPs 5 (see S107), the controller 7 may determine that the resetting conditions are satisfied. When the number of recorded mapping data reaches a predetermined number of times, the controller 7 may determine that the resetting conditions are satisfied.

When the resetting conditions are not satisfied ("No" in S111), the process of the controller 7 returns to step S105, mapping is performed for the next production FOUP 5, the mapping data is stored, and a predetermined process is performed on the wafers accommodated in the production FOUP 5.

When the resetting conditions are satisfied ("Yes" in S111), the process of the controller 7 proceeds to step S112. In step S112, the controller 7 resets (corrects) the reference position and the upper and lower limit threshold values of each slot of the FOUP 5 based on the stored mapping data of a plurality of FOUPs 5.

Thereafter, the controller 7 makes an error determination (a determination as to whether or not the wafer W can be taken out normally (see S110)) using the range of the reference position and the upper and lower limit threshold values of each slot reset (corrected) in step S112, and continues the production of semiconductor products (see S105 to S110). After resetting (correcting) the reference positions or the like in step S112, the process of the controller 7 may return to step S105. As a result, when the resetting conditions are satisfied again, the reference positions and the like can be set (corrected) again.

<Method of Correcting Reference Position and Upper and Lower Limit Positions in First Embodiment>

Figure 5A:
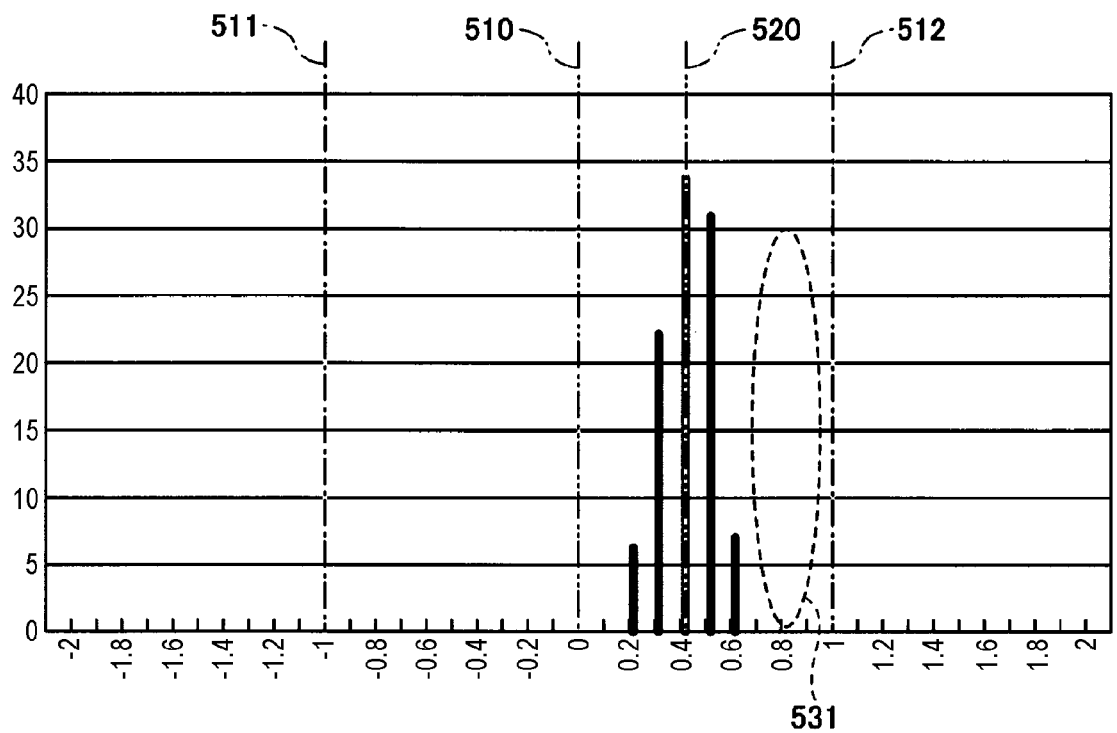
FIGS. 5A and 5B are graphs each showing an example of a reference position, and upper and lower limit threshold values as a result of detecting height positions of wafers in a first embodiment.
Figure 5B:
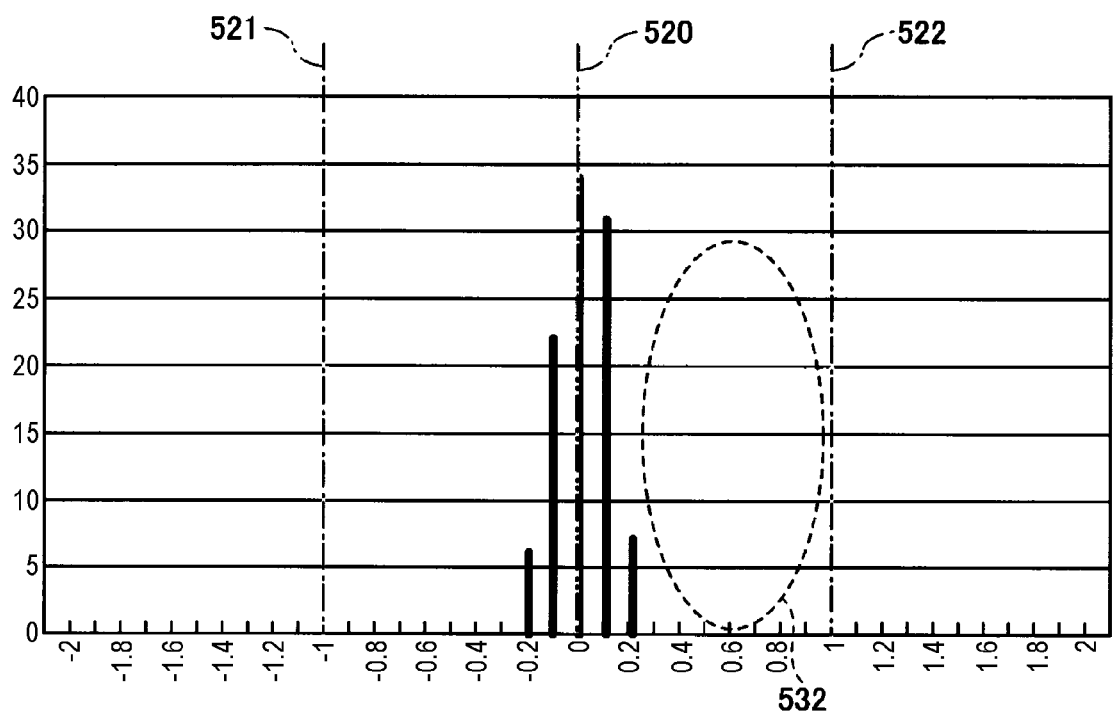

Next, a method of correcting reference positions and upper and lower limit positions in step S112 will be described with reference to FIGS. 5A and 5B. FIGS. 5A and 5B are graphs each showing an example of a reference position, and upper and lower limit threshold values as a result of detecting the height positions of wafers W in a predetermined slot (e.g., a $13^{th}$ slot) of FOUPs 5 in the first embodiment.

FIG. 5A is a graph showing a reference position 510 set using a teaching FOUP 5 in the predetermined slot (e.g., the $13^{th}$ slot), and a relationship of height positions of wafers W of production FOUPs 5 with respect to the reference position 510. In FIG. 5A, the horizontal axis represents the amounts of deviations between height positions of wafers W in the predetermined slots detected in step S106 and the reference position in the predetermined slot in step S103. The vertical axis represents the number of counts. The reference position 510 of the predetermined slot in step S103 is indicated by an alternate long and two short dash line, and the lower limit threshold value 511 and the upper limit threshold value 512 of the predetermined slot of step S103 are indicated by alternate long and short dash lines.

Here, the height positions of the slots of FOUPs 5 differ within the range of the standard of FOUPs 5. Since the FOUP 5 used during teaching in steps S101 to S103 is one FOUP of a plurality of FOUPs 5, when the FOUP 5 used during teaching is deviated from the standard height dimension to one side (the side at which the height position is lower in FIG. 5A) within the standard range, the margin 531 up to the error determination on the other side is reduced. Therefore, in the production FOUP 5, the frequency of error occurrence may increase. For example, by performing teaching using a teaching FOUP 5 deviated to one side within the standard range, the wafer W accommodated in a slot of the production FOUP 5 deviated to the other side may be determined to be an error.

In contrast, in step S112, the controller 7 resets the reference position 520 of each slot based on the mapping data of FOUPs 5 of a plurality of different FOUPs. In other words, the reference position of each slot is corrected based on a difference between the reference position 510 of the teaching FOUP 5 and the reference position 520 obtained from the production FOUPs 5 of a plurality of different FOUPs. Further, in each slot, the upper and lower limit threshold values (the lower limit threshold value and the upper limit threshold value) are reset based on a new reference position 520.

For example, when mapping data is detected for the FOUPs 5 of the plurality of different individuals and thus the height positions of predetermined slots of the FOUPs 5 exhibit a normal distribution, the controller 7 may set the center of the normal distribution as the new reference position 520.

The method of correcting the reference position 520 is not limited to the above. For example, the controller 7 may obtain the reference position 520 from an average value of the height positions of the wafers W detected in step S106. As a result, even when the number of detected FOUPs 5 is small, the reference position may be reset (corrected) based on plural pieces of mapping data.

In addition, the controller 7 may obtain the reference position 520 from an intermediate value between the maximum value and the minimum value among the height positions of the plurality of wafers W detected in step S106. This makes it possible to achieve a further improvement in terms of the frequency of error occurrence.

FIG. 5B is a graph showing a relationship between the reference position 520 reset in the predetermined slot (e.g., the $13^{th}$ slot), and the height positions of the wafers W of the production FOUPs 5 with respect to the reference position 520. In FIG. 5B, the horizontal axis represents the amounts of deviation between the height positions of the wafers W in the predetermined slot detected in step S106 and the reference position 520 in the predetermined slot in step S112. The vertical axis represents the number of counts. The reference position 520 of the predetermined slot in step S112 is indicated by an alternate long and two short dash line, and the lower limit threshold value 521 and the upper limit threshold value 522 of the predetermined slot of step S112 are indicated by alternate long and short dash lines.

As a result, a margin 532 up to the error determination on the other side can be secured, and thus it is possible to achieve an improvement in terms of the frequency of error occurrence.

The resetting of the reference position and the upper and lower limit threshold values in the predetermined slot (e.g., the $13^{th}$ slot) has been described with reference to FIGS. 5A and 5B, but reference position and the upper and lower limit threshold values may be similarly reset with respect to the other slots (e.g., $1^{st}$ to $12^{th}$ and $14^{th}$ to $25^{th}$ slots).

<Method of Correcting Reference Position and Upper and Lower Limit Positions in Second Embodiment>

Figure 6A:
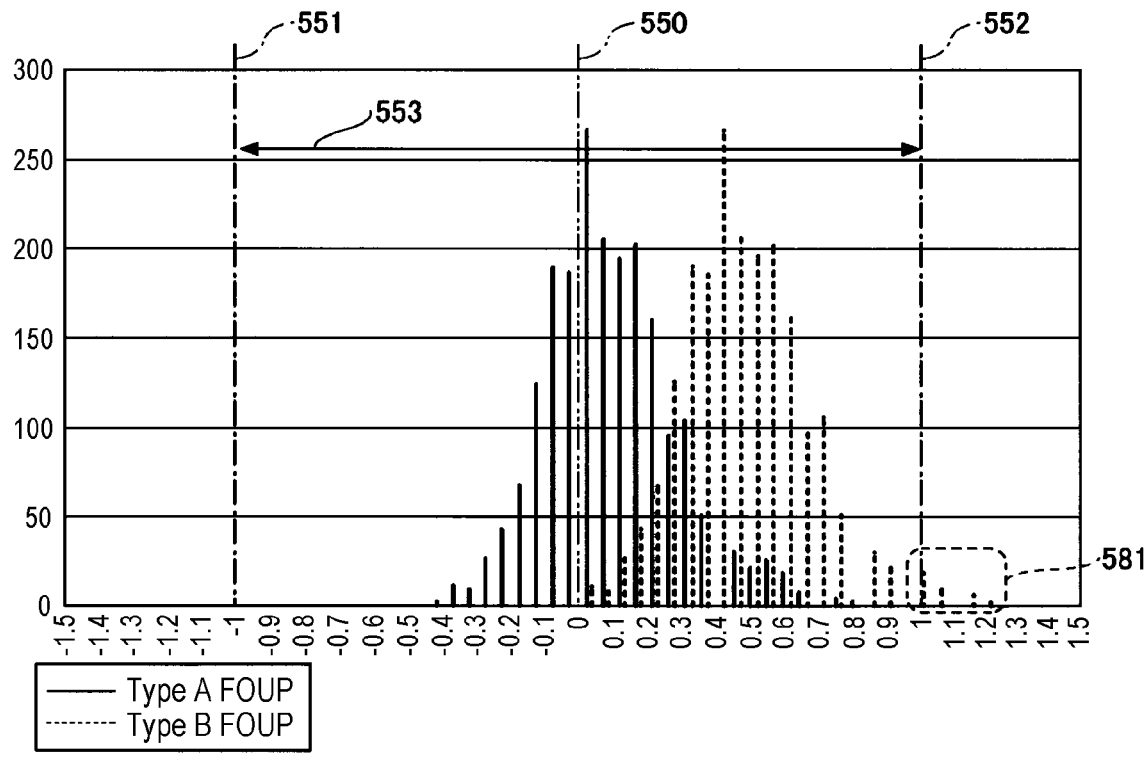
FIGS. 6A and 6B are graphs each showing an example a reference position, and upper and lower limit threshold values as a result of detecting height positions of wafers in a second embodiment.
Figure 6B:
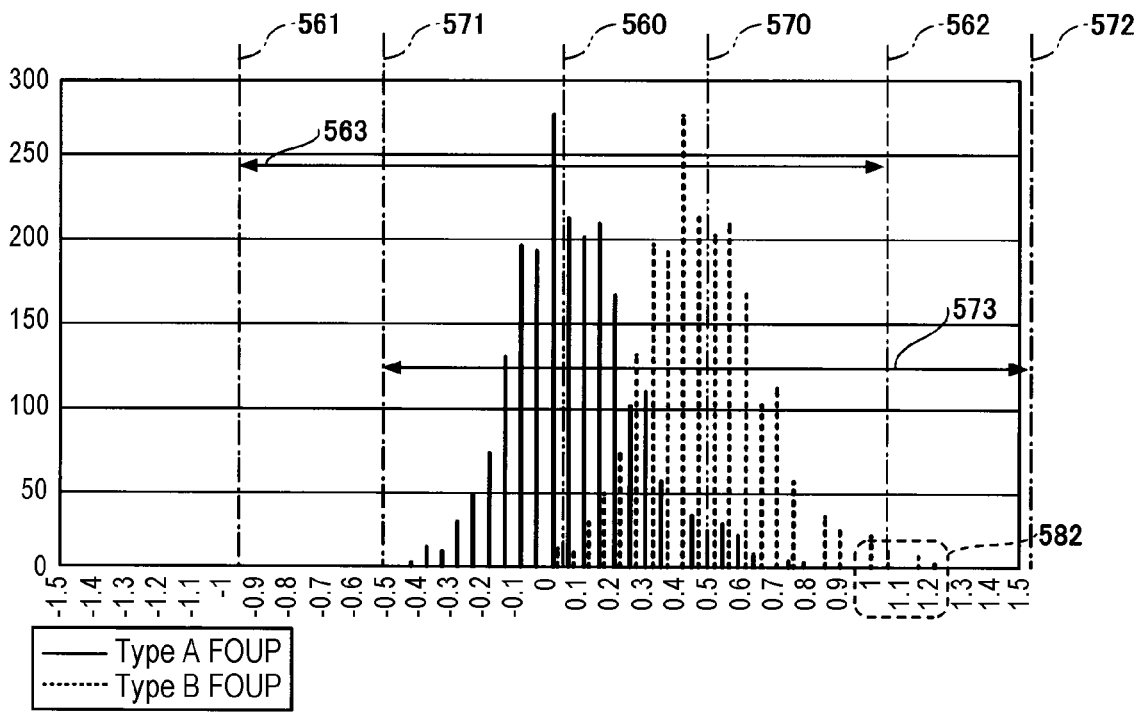

Next, another method of correcting the reference position and the upper and lower limit positions in step S112 will be described with reference to FIGS. 6A and 6B. FIGS. 6A and 6B are graphs each showing an example of a detection result, a reference position, and upper and lower limit threshold values of the height positions of the wafers W in the predetermined slot (e.g., the 13$^{th}$ slot) of FOUPs 5 in the second embodiment.

FIG. 6A is a graph showing a relationship between a reference position 550 set using a teaching FOUP 5 in the predetermined slot (e.g., the 13$^{th}$ slot), and height positions of the wafers W of the production FOUPs 5 with respect to the reference position 550. In FIG. 6A, the horizontal axis represents the amounts of deviations between the height positions of the wafers W in the predetermined slot detected in step S106 and the reference position in the predetermined slot in step S103. The vertical axis represents the number of counts. The reference position 550 of the predetermined slot in step S103 is indicated by an alternate long and two short dash line, the lower limit threshold value 551 and the upper limit threshold value 552 of the predetermined slot in step S103 are indicated by alternate long and short dash lines, and the range of the upper and lower limit threshold values 553 is indicated by an arrow.

Here, production FOUPs 5 of type A and production FOUPs 5 of type B are installed in the load ports 4. In FIGS. 6A and 6B, the numbers of counts of the production FOUPs 5 of type A are indicated by solid lines, and the numbers of counts of the production FOUPs 5 of type B are indicated by dotted lines. In addition, the tendencies of height positions of wafers W may differ depending on the types. Therefore, in the example of FIG. 6A, the wafers W accommodated in the slots of the production FOUPs 5 of type B having a range 581 exceeding the upper limit threshold value 552 are determined to be an error.

In contrast, in step S112, the controller 7 resets a reference position 560 or 570 of each slot based on the mapping data of FOUPs 5 of a plurality of different FOUPs for each type. Here, in step S107, the controller 7 stores identification information including the type information of FOUPs 5 detected by the detector 42 and the mapping data detected in step S106 in the storage (not illustrated) to be in association with each other. The controller 7 sets the reference position 560 based on the mapping data of the FOUPs 5 of a plurality of different FOUPs of type A. In addition, the controller 7 sets the reference position 570 based on the mapping data of the FOUPs 5 of a plurality of different FOUPs of type B.

FIG. 6B is a graph showing a relationship between the reference position 560 or 570 reset in the predetermined slot (e.g., the 13$^{th}$ slot), and the height positions of the wafers W of production FOUPs 5 with respect to the reference position 550. In FIG. 6B, the horizontal axis indicates the amount of deviation between the height position of the wafer W in the predetermined slot detected in step S106 and the reference position in the predetermined slot in step S103. The vertical axis represents the number of counts. The reference position 560 of the predetermined slot of the FOUP 5 of type A reset (corrected) in step S112 is indicated by an alternate long and two short dash line, the lower limit threshold value 561 and the upper limit threshold value 562 of the predetermined slot of the FOUP 5 of type A reset (corrected) in step S112 are indicated by alternate long and short dash lines, and the range of the upper and lower limit threshold values 563 of the predetermined slots of the FOUPs 5 of type A is indicated by an arrow. In addition, the reference position 570 of the predetermined slot of the FOUP 5 of type B reset (corrected) in step S112 is indicated by an alternate long and two short dash line, the lower limit threshold value 571 and the upper limit threshold value 572 of the predetermined slot of the FOUP 5 of type B reset (corrected) in step S112 are indicated by alternate long and short dash lines, and the range of the upper and lower limit threshold values 573 of the predetermined slots of the FOUPs 5 of type B is indicated by an arrow.

Then, in the production of semiconductor products after step S112, the controller 7 reads the identifier 52 of the FOUP 5 installed in the load port 4 by the detector 42 to specify the type of the FOUP 5 and performs an error determination (a determination as to whether or not the wafer W can be taken out normally (see S110)) using the range of upper and lower limit threshold values (the range 563 or the range 573) of each slot corresponding to the type.

As a result, in the example of FIG. 6B, the FOUP 5 of type B in the range 582 is within the range 573 of the upper and lower limit threshold values of type B, and it is possible to prevent the FOUP 5 from being determined to be an error. This makes it possible to achieve an improvement in terms of the frequency of error occurrence.

The resetting of the reference position and the upper and lower limit threshold values in the predetermined slot (e.g., the 13th slot) has been described with reference to FIGS. 6A and 6B, but reference position and the upper and lower limit thresholds may be similarly reset with respect to the other slots (e.g., the 1$^{st}$ to 12$^{th}$ and 14$^{th}$ to 25$^{th}$ slots).

In the foregoing, a substrate processing apparatus according to an embodiment has been described, but the present disclosure is not limited to the above-described embodiment or the like, and can be variously modified and improved within the scope of the present disclosure described in the claims.

In step S111, the resetting conditions are not limited to those described above. For example, when the operator performs an operation of executing resetting at an arbitrary timing, the controller 7 may determine that the resetting conditions are satisfied.

In addition, the controller 7 may cause a display device (not illustrated) to display a warning that urges correction of the reference position or the like after processing the FOUPs 5 a predetermined number of times, for example, after setting the reference position or the like (S103 and S112). The controller 7 may cause the display device (not illustrated) to display a warning, for example, after a predetermined period of time has elapsed from setting the reference position or the like (S103 and S112). In addition, the controller 7 may calculate a reference position based on, for example, acquired mapping data and may cause the display device (not illustrated) to display a warning when the amount of deviation between the set reference positions (S103 and S112) and the reference position calculated based on the mapping data exceeds a predetermined threshold value. Then, when an operator who has confirmed the warning display performs an operation to execute the resetting, the controller 7 may determine that the resetting conditions are satisfied. This makes it possible to urge the operator to reset the reference position or the like so that the occurrence of an error can be suppressed.

The controller 7 may determine that the reset conditions are satisfied after processing the FOUP 5 a predetermined number of times, for example, after setting the reference position or the like (S103 and S112). In addition, the controller 7 may determine that the resetting conditions are satisfied, for example, after a predetermined period of time has elapsed from setting the reference position or the like (S103 and S112). Furthermore, the controller 7 may determine that the reset conditions are satisfied when, for example, the amount of deviation between the set reference position (S103 and S112) and the reference position calculated based on the mapping data exceeds a predetermined threshold value. This makes it possible to automatically perform the resetting of the reference position or the like so that the occurrence of an error can be suppressed.

According to an aspect, it is possible to provide a method of teaching a transfer device, and a transfer system.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of teaching a transfer device provided with a pick configured to hold a substrate and a mapping sensor, the method comprising:
   detecting, in a reference accommodation container in which reference substrates are accommodated, height positions of the reference substrates using the mapping sensor and setting a reference position in a height direction;
   detecting, in a plurality of accommodation containers in which production substrates to be processed in a substrate processing apparatus are accommodated, height positions of the production substrates using the mapping sensor and storing information related to the height positions of the production substrates; and
   correcting the reference position based on the stored information in the plurality of accommodation containers,
   wherein the reference accommodation container includes a plurality of slots for mounting the reference substrates in the height direction, and
   wherein the detecting height positions of the reference substrates includes:
   detecting a first reference position of the substrate accommodated in the lowermost first slot of the reference accommodation container;
   detecting a last reference position of the substrate accommodated in the uppermost last slot of the reference accommodation container; and
   setting intermediate reference positions of the substrates accommodated between the lowermost first slot and the uppermost last slot by equally dividing a distance between the first reference position and the last reference position.

2. The method of claim 1, further comprising:
   determining whether or not the detected height positions of the production substrates are within a range of upper and lower limit threshold values corresponding to the reference position.

3. The method of claim 2, wherein the information includes information related to the height positions and information related to a plurality of kinds of the plurality of accommodation containers, and
   wherein in the correcting the reference position, the reference position is corrected for each of the plurality of kinds.

4. The method of claim 3, wherein, in the correcting the reference position, the reference position is corrected such that a center of a normal distribution of the height positions is set to the reference position.

5. The method of claim 3, wherein, in the correcting the reference position, the reference position is corrected such that an average value of the height positions is set to the reference position.

6. The method of claim 3, wherein, in the correcting the reference position, the reference position is corrected such that an intermediate value between a maximum value and a minimum value of the height positions is set to the reference position.

7. The method of claim 1, wherein the information includes information related to the height positions and information related to a plurality of kinds of the plurality of accommodation containers, and
   wherein in the correcting the reference position, the reference position is corrected for each of the plurality of kinds.

8. The method of claim 1, wherein, in the correcting the reference position, the reference position is corrected such that a center of a normal distribution of the height positions is set to the reference position.

9. The method of claim 1, wherein, in the correcting the reference position, the reference position is corrected such that an average value of the height positions is set to the reference position.

10. The method of claim 1, wherein, in the correcting the reference position, the reference position is corrected such that an intermediate value between a maximum value and a minimum value of the height positions is set to the reference position.

11. A transfer system comprising:
    a transfer device including a pick configured to hold a substrate and a mapping sensor; and
    a controller,
    wherein the controller is configured to:
    control the transfer device to detect, in a reference accommodation container in which reference substrates are accommodated, height positions of the reference substrates using the mapping sensor and setting a reference position in a height direction;
    detect, in a plurality of accommodation containers in which production substrates to be processed in a substrate processing apparatus are accommodated, height positions of the production substrates using the mapping sensor and storing information related to the height positions of the production substrates; and
    correct the reference position based on the stored information in the plurality of accommodation containers,
    wherein the reference accommodation container includes a plurality of slots for mounting the reference substrates in the height direction, and
    wherein the controller is configured to control the transfer device to detect the height positions of the reference substrates by:
    detecting a first reference position of the substrate accommodated in the lowermost first slot of the reference accommodation container;
    detecting a last reference position of the substrate accommodated in the uppermost last slot of the reference accommodation container; and
    setting intermediate reference positions of the substrates accommodated between the lowermost first slot and the uppermost last slot by equally dividing a distance between the first reference position and the last reference position.

\* \* \* \* \*